(12) United States Patent
Hooi

(10) Patent No.: US 7,642,136 B2
(45) Date of Patent: Jan. 5, 2010

(54) METHOD AND APPARATUS FOR REDUCING STRESSES APPLIED TO BONDED INTERCONNECTS BETWEEN SUBSTRATES

(75) Inventor: Kean Seong Hooi, Georgetown (MY)

(73) Assignee: Motorola, Inc., Schaumburg, IL (US)

( * ) Notice: Subject to any disclaimer, the term of this patent is extended or adjusted under 35 U.S.C. 154(b) by 4 days.

(21) Appl. No.: 11/749,981

(22) Filed: May 17, 2007

(65) Prior Publication Data

US 2008/0119014 A1 May 22, 2008

Related U.S. Application Data

(62) Division of application No. 11/039,975, filed on Jan. 21, 2005, now abandoned.

(51) Int. Cl.
*H01L 21/44* (2006.01)
*H01L 21/48* (2006.01)

(52) U.S. Cl. .................. 438/118; 438/108; 438/126; 438/127; 257/704; 257/E23.181

(58) Field of Classification Search .............. 438/125, 438/112, 118, 126, 128; 257/704, 783, E23.281
See application file for complete search history.

(56) References Cited

U.S. PATENT DOCUMENTS

| 6,069,023 | A * | 5/2000 | Bernier et al. ............... 438/107 |
| 6,488,806 | B2 * | 12/2002 | Carden et al. ............... 156/311 |
| 6,635,953 | B2 * | 10/2003 | Wu ............................. 257/659 |
| 6,686,653 | B2 | 2/2004 | Jerominek et al. |
| 6,747,361 | B2 | 6/2004 | Ichinose |
| 6,781,066 | B2 | 8/2004 | Heng |
| 2001/0040006 | A1 * | 11/2001 | Pompeo et al. .......... 156/307.1 |
| 2004/0150097 | A1 * | 8/2004 | Gaynes et al. ............... 257/704 |

* cited by examiner

*Primary Examiner*—Nitin Parekh
(74) *Attorney, Agent, or Firm*—Larry Brown; Sylvia Chen

(57) ABSTRACT

A method (200) is provided for reducing stresses applied to one or more bonded interconnects (106) of a substrate (103) and a PCB (Printed Circuit Board) (104). The method comprises the steps of coupling (204) a compound (108) on a top surface of the substrate, wherein the compound has the property of expanding when a heat profile is applied thereto, coupling (206) a cover (102) to the PCB that overhangs at least a portion of the compound, and applying (208) the heat profile to the compound and optionally the cover and/or PCB. More than one apparatus implementing the method is also included.

9 Claims, 3 Drawing Sheets

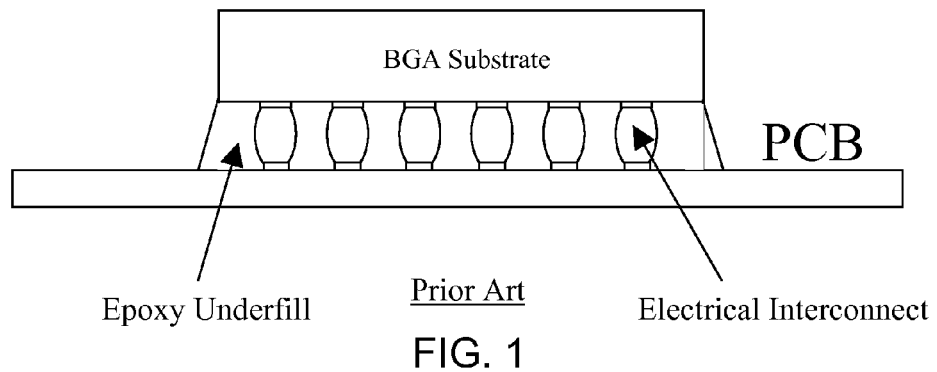
Prior Art
FIG. 1
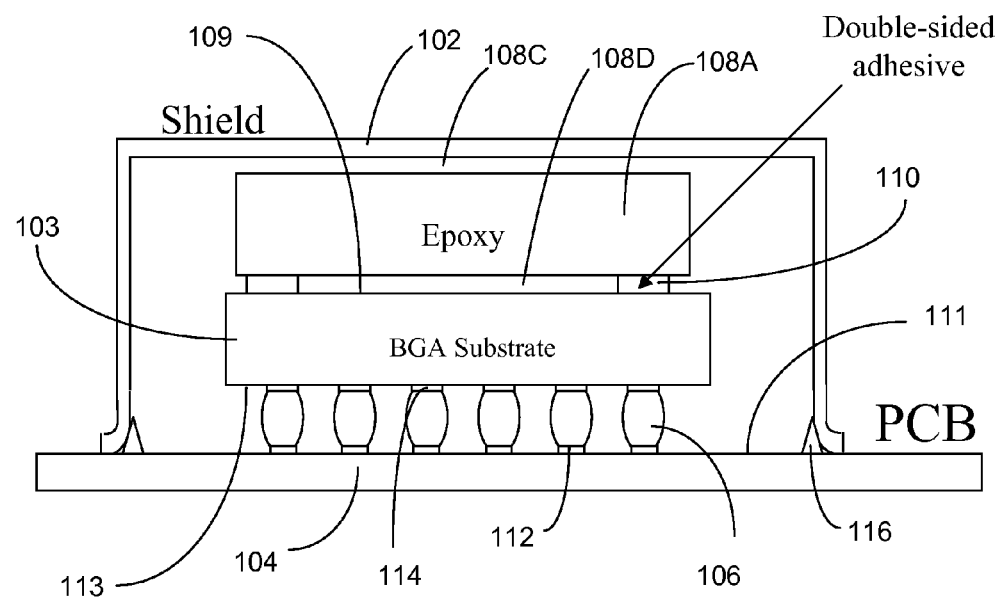
FIG. 2  100

US 7,642,136 B2

METHOD AND APPARATUS FOR REDUCING STRESSES APPLIED TO BONDED INTERCONNECTS BETWEEN SUBSTRATES

RELATED APPLICATION

This application is a Divisional of Ser. No. 11/039,975, filed Jan. 21, 2005. Applicant claims priority thereof.

FIELD OF THE INVENTION

This invention relates generally to surface mount technology, and more particularly to a method and apparatus for reducing stresses applied to bonded interconnects between substrates.

BACKGROUND OF THE INVENTION

Typically, an IC (Integrated Circuit) packaged as a BGA (Ball Grid Array) having a high density of electrical interconnects bonded to a second substrate such as a PCB (Printed Circuit Board) is susceptible to interconnect fractures when stresses from, for example, a mechanical drop are applied thereto. To reduce these fractures, liquid epoxy can be applied as underfill to fill gaps between the solder bumps of the BGA and the PCB as shown in FIG. 1.

This process, however, is undesirable due to the manual labor involved during application, impact on manufacturing throughput, and often inconsistent and messy applications of liquid epoxy, which impacts serviceability of the end product.

The embodiments of the invention presented below overcome this disadvantage in the prior art.

SUMMARY OF THE INVENTION

Embodiments in accordance with the invention provide a method and apparatus for reducing stresses applied to bonded interconnects between substrates.

In a first embodiment of the present invention, a method is provided for reducing stresses applied to one or more bonded interconnects of a substrate and a PCB (Printed Circuit Board). The method comprises the steps of coupling a compound on a top surface of the substrate, wherein the compound has a property of expanding when a heat profile is applied thereto, coupling a cover to the PCB that overhangs at least a portion of the compound, and applying the heat profile to at least a portion of the foregoing components. The heat profile can be applied to the compound and optionally to the cover and/or PCB.

In a second embodiment of the present invention, a substrate for coupling to a PCB having one or more bonding interconnects is coupled to a bottom surface of the substrate for electrical bonding to the PCB, and a cover that overhangs at least a portion of a compound. The compound has a property of expanding when a heat profile is applied thereto. A process is applied to the foregoing components that couples the compound on a top surface of the substrate and to the cover when the heat profile is applied to at least a portion of the foregoing components.

In a third embodiment of the present invention, a selective call radio (SCR) having an optional display for presenting text and graphics to an end user of the SCR and an optional keypad for manipulating functions of the SCR includes a transceiver for processing signals from a communication system, a memory for storage, a power supply for supplying power to the components of the SCR, an audio system for presenting audible signals to the end user of the SCR, and a processor coupled to the foregoing components for control thereof. One or more foregoing components of the SCR have a surface mount IC that couples to a PCB having one or more solder bumps, a compound having a property of expanding when a heat profile is applied thereto, a cover, and a double-sided adhesive. A process can be applied to the foregoing components of the surface mount IC and the PCB that includes coupling the one or more solder bumps between an electrical pad of a bottom surface of the surface mount IC and a corresponding electrical pad on the PCB, coupling the double-sided adhesive between a surface of the compound and a top surface of the surface mount IC, coupling the cover on the PCB so that it overhangs at least a portion of the compound, and applying the heat profile to at least a portion of the foregoing components.

BRIEF DESCRIPTION OF THE DRAWINGS

FIG. 1 is a diagram of a prior art IC (Integrated Circuit) packaged as a BGA (Ball Grid Array) with epoxy underfill applied to interconnects between the IC and a PCB (Printed Circuit Board).

FIGS. 2 and 3 are diagrams depicting a substrate for coupling to a PCB in accordance with an embodiment of the present invention.

DETAILED DESCRIPTION

Figure 3:
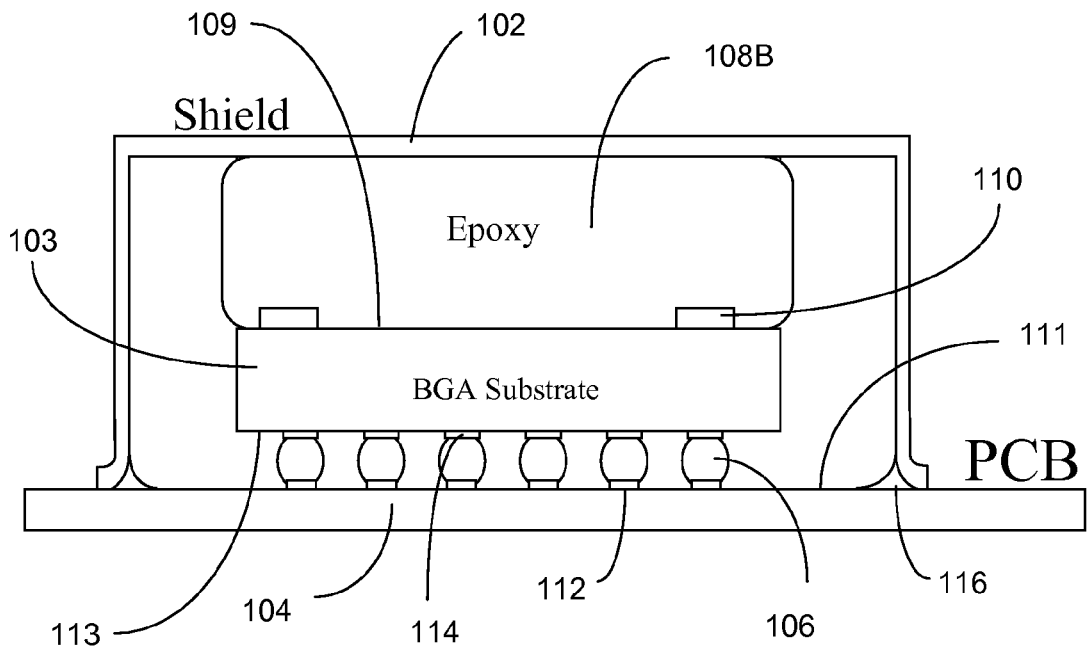

While the specification concludes with claims defining the features of embodiments of the invention that are regarded as novel, it is believed that the embodiments of the invention will be better understood from a consideration of the following description in conjunction with the figures, in which like reference numerals are carried forward.

FIGS. 2 and 3 are diagrams depicting the before and after effects of a process 200 (shown in FIG. 4) applied to a substrate 103 for coupling to a PCB 104 in accordance with an embodiment of the present invention. The substrate 103 has one or more bonding interconnects 106 coupled to a bottom surface 113 of the substrate 103 and the PCB 104 a portion of which carry electrical signals to the PCB 104. In the present illustrations, the substrate 103 can comprise a surface mount IC (Integrated Circuit), herein referred to as IC 103, carrying one or more conventional transistors and/or other conventional electrical components that produce a known function (e.g., a microprocessor, a memory, or a transceiver, just to name a few).

The one or more bonded interconnects 106 can comprise one or more solder bumps, herein referred to as solder bumps 106. The solder bumps 106 are coupled to an electrical pad 114 of the bottom surface 113 of the IC 103 a portion of which can be electrically coupled to the electrical components carried by the IC 103. The solder bumps 106 are further coupled to a corresponding electrical pad 112 on a top surface 111 of the PCB 104, which can be aligned with the electrical pads 114 of the IC 103. The electrical pads 112 of the PCB 104 provide connectivity to other components (not shown) located on the PCB 104 utilizing conventional technology such as traces and vias distributed among interconnecting layers of the PCB 104.

Figure 4:
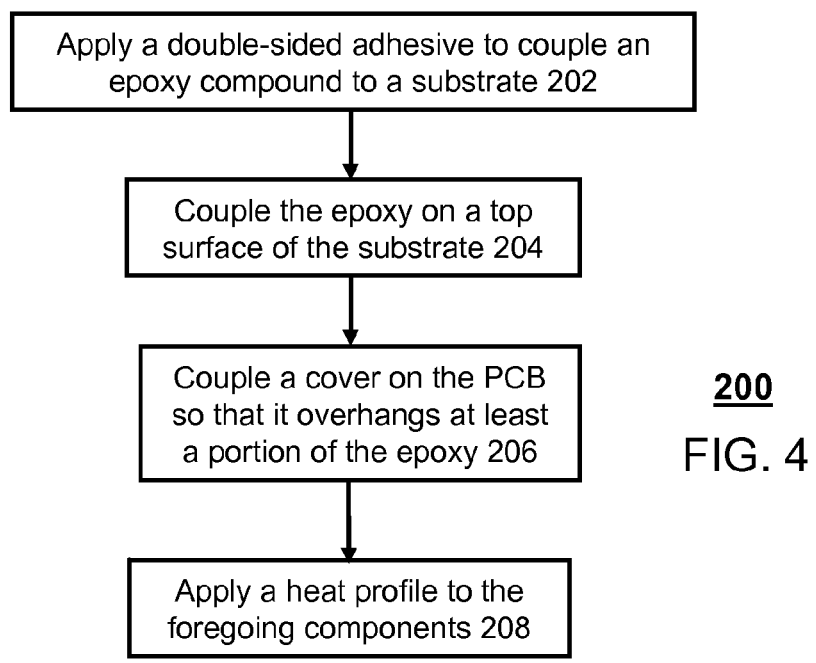
FIG. 4 is a flow chart depicting the process applied to the substrate and PCB of FIGS. 2 and 3 for reducing stresses applied thereto in accordance with an embodiment of the present invention.

Referring to FIG. 4, in its simplest embodiment the process 200 begins with step 204 where a conventional compound 108A having a property of expanding when a heat profile is applied thereto is coupled to a top surface 109 of the IC 103. In a supplemental embodiment, a double-sided adhesive 110 can be applied in step 202 to the epoxy compound 108A for coupling to the top surface 109 of the IC 103. Alternatively, the double-sided adhesive 110 can be applied in step 202 to the top surface 109 of the IC 103 for coupling with the epoxy compound 108A. The compound 108A can comprise a conventional epoxy resin, referred hereinafter as an epoxy 108A.

It would be appreciated by one of ordinary skill in the art that any method suitable to the present invention can be used to couple the epoxy 108A to the IC 103. Moreover, any conventional compound 108A having the property of expanding with application of a heat profile can be used also.

In step 206 a cover 102 is coupled to the PCB 104 that overhangs at least a portion of the epoxy 108A. The cover 102 can be a conventional shield (herein referred to as a shield 102) that is electrically coupled to the PCB 104 for reducing EMI (Electromagnetic Interference) radiated by the IC 103, and for reducing EMI entering the shield 102. The shield 102 can be electrically coupled by way of solder 116 interconnecting the shield 102 to an electrical pad (not shown) of the PCB 104. The portion of the shield 102 overhanging the epoxy 108A has rigidity sufficient to reduce stresses applied to the one or more electrical bonded interconnects 106. Such stresses can come about from physical drops or other forces applied to a device carrying the components of FIGS. 2 and 3.

Once the shield 102 has been coupled to the PCB 104, there may be gaps or voids 108C and 108D above and below the epoxy 108A, respectively, as shown in FIG. 2. When a heat profile is applied in step 208 to the aforementioned components of FIG. 2 the gaps 108C-108D are removed in whole or in part by the expansion of the epoxy 108B as shown in FIG. 3. After the epoxy 108B hardens, the epoxy 108B serves to reduce stresses applied to the bonding interconnects 106 of FIG. 3, thereby substantially eliminating stress fractures that may cause intermittent electrical failure.

One method to apply the heat profile in step 208 is with the use of a conventional reflow oven. The reflow oven gradually applies heat to the components of FIG. 2 until reaching a peak temperature followed by a gradual cooling off cycle. Heating profiles are well known in the art and can be adjusted to suit the compound and materials used in the assembly of the IC 103 and PCB 104 in FIG. 2. Accordingly, any heat profile suitable to the present invention can be used and is not necessarily limited to a reflow oven.

Figure 5:
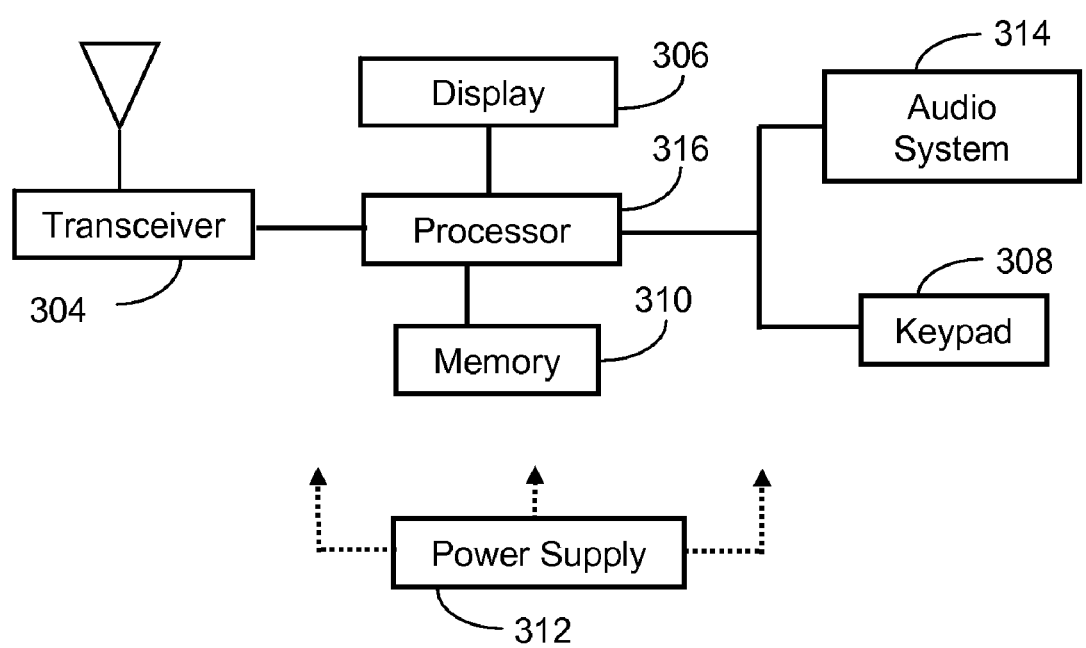
FIG. 5 shows a block diagram of a selective call radio (SCR) having one or more components utilizing the process depicted in FIGS. 2-4 in accordance with an embodiment of the present invention.

The foregoing structure and processes of FIGS. 2-4 can be embodied in one or more components of a selective call radio (SCR) 300, a block diagram of which is shown in FIG. 5 in accordance with an embodiment of the present invention.

The SCR 300 comprises conventional electrical components such as a transceiver 304 for processing signals from a communication system (such as a cellular network), a display 306 for presenting text and graphics to an end user of the SCR 300, a keypad 308 for manipulating functions of the SCR 300 by way of, for example, a UI (User Interface) presented by the display 308, a memory 310 for storage of software and data, a power supply 312 for supplying power to the components of the SCR 300, an audio system 314 for presenting audible signals to the end user of the SCR 300, and a processor 316 coupled to the foregoing components 304-314 for control thereof. Any one of the foregoing components 304-316 in whole or in part can utilize an IC 103 that couples to the PCB 104 as described above.

The aforementioned process and apparatus of the present invention can be performed robotically thereby eliminating manual labor and improving manufacturing throughput. In addition, the compound 108 can be applied to the substrate 103 in a controlled manner thereby eliminating messy applications and improving field serviceability.

In light of the foregoing description, it should be evident that embodiments in the present invention could be realized in numerous configurations contemplated to be within the scope and spirit of the claims below. It should also be understood that the claims are intended to cover the structures described herein as performing the recited function and not only structural equivalents. For example, although a nail and a screw fastener may not be structural equivalents in that the nail has no spiral threading like the screw fastener, a nail and a screw fastener can be used for securing objects firmly together, thereby making the nail and screw fastener equivalent structures. Accordingly, equivalent structures that read on the description provided herein are intended to be included within the scope of the invention as defined in the following claims.

What is claimed is:

1. A method for reducing stresses applied to one or more bonded interconnects of a substrate and a PCB (Printed Circuit Board), comprising the steps of:
    coupling a compound on a top surface of the substrate, wherein the compound has a property of expanding when a heat profile is applied thereto;
    coupling a cover on the PCB so that it overhangs at least a portion of the compound;
    applying a double-sided adhesive between the compound and a top surface of the substrate at respective perimeter portions, before coupling the cover, leaving voids (i) below the compound and above the top surface of the substrate interior to the perimeter portions and (ii) above the compound and below the cover; and
    applying the heat profile to at least the compound and the double-sided adhesive thereby causing the compound to expand such that the compound removes the voids (1) below the compound and above the top surface of the substrate and (2) above the compound and below the cover.

2. The method of claim 1, wherein the substrate comprises a surface mount IC (Integrated Circuit), and wherein the one or more electrically bonded interconnects comprise one or more solder bumps coupled between an electrical pad of the bottom surface of the surface mount IC and a corresponding electrical pad on a top surface of the PCB.

3. The method of claim 1, wherein the compound comprises an epoxy resin.

4. The method of claim 1, wherein the applying the double-sided adhesive comprises: applying the double-sided adhesive to the compound for coupling to the top surface of the substrate.

5. The method of claim 1, wherein the applying the double-sided adhesive comprises: applying the double-side adhesive to edges of the top surface of the substrate for coupling to the compound.

6. The method of claim 1, wherein the cover comprises a shield electrically coupled to the PCB for reducing EMI (Electromagnetic Interference) radiated by the substrate, and for reducing EMI entering the shield.

7. The method of claim 1, wherein the portion of the cover overhanging the compound has rigidity sufficient to reduce stresses applied to the one or more electrically bonded interconnects.

8. The method of claim 1, wherein applying the heat profile to at least the compound and the double-sided adhesive comprises applying the heat profile with a reflow oven.

9. The method of claim 1 wherein coupling the cover on the PCB further comprises coupling the cover on the PCB so that the cover is attached to the PCB and the cover overhangs at least a portion of the compound.

* * * * *